United States Patent
Grudin et al.

(10) Patent No.: US 8,022,717 B2
(45) Date of Patent: Sep. 20, 2011

(54) THERMAL PRE-SCANNING OF ELECTRIC CIRCUITS USING THERMALLY-TRIMMABLE RESISTORS

(75) Inventors: Oleg Grudin, Montreal (CA); Leslie M. Landsberger, Montreal (CA); Gennadiy Frolov, Montreal (CA)

(73) Assignee: Sensortechnics GmbH, Puchheim (DE)

( * ) Notice: Subject to any disclaimer, the term of this patent is extended or adjusted under 35 U.S.C. 154(b) by 366 days.

(21) Appl. No.: 12/294,082

(22) PCT Filed: Mar. 16, 2007

(86) PCT No.: PCT/CA2007/000438
§ 371 (c)(1),
(2), (4) Date: Mar. 11, 2009

(87) PCT Pub. No.: WO2007/106990
PCT Pub. Date: Sep. 27, 2007

(65) Prior Publication Data
US 2009/0322356 A1 Dec. 31, 2009

Related U.S. Application Data

(60) Provisional application No. 60/784,785, filed on Mar. 23, 2006.

(51) Int. Cl.
*G01R 27/08* (2006.01)
(52) U.S. Cl. .................................. 324/691; 324/703
(58) Field of Classification Search .................. None
See application file for complete search history.

(56) References Cited

U.S. PATENT DOCUMENTS

| | | | | |
|---|---|---|---|---|
| 5,608,333 | A * | 3/1997 | Hayashi | 324/711 |
| 7,555,829 | B2 * | 7/2009 | Grudin et al. | 29/610.1 |
| 2006/0017488 | A1 | 1/2006 | Hsu | |

FOREIGN PATENT DOCUMENTS

| | | |
|---|---|---|
| WO | WO03023794 | 3/2003 |
| WO | WO2004046737 | 6/2004 |
| WO | WO2005006100 | 1/2005 |
| WO | WO2005086163 | 9/2005 |

OTHER PUBLICATIONS

Feldbaumer et al., "Pulse Current Trimming of Polysilicon Resistors", Motorola Semiconductor Products Sector, Chandler, AZ 82448, USA, IEEE Transactions on Electron Devices, vol. 42, No. 4, Apr. 1995.
Babcock et al., "Polysilicon Resistor Trimming for Packaged Integrated Circuits", Motorola Semiconductor Products Sector, Logic IC Division, Mesa, AZ 85202, IEEE 1993.

* cited by examiner

*Primary Examiner* — Minh N Tang
(74) *Attorney, Agent, or Firm* — Norton Rose OR LLP

(57) ABSTRACT

There is described a method to change the value of a thermally-trimmable resistor in a non-permanent way by raising the temperature of the thermally-trimmable resistor to a level that is somewhere between room temperature and trimming temperature. By doing this, the trimming range that is available via true thermal trimming may be explored without actually trimming the value of the resistor. This is possible when the thermally-trimmable resistor, or a portion thereof, has an essentially non-zero temperature coefficient of resistance (TCR).

20 Claims, 1 Drawing Sheet

THERMAL PRE-SCANNING OF ELECTRIC CIRCUITS USING THERMALLY-TRIMMABLE RESISTORS

CROSS-REFERENCE TO RELATED APPLICATIONS

This application claims priority of U.S. Provisional Patent Application No. 60/784,785 filed on Mar. 23, 2006.

TECHNICAL FIELD

The invention relates to the trimming of a resistor or resistors, suitable for use at any level of the manufacturer-to-user chain. More specifically, it relates to trimming by resistive heating using electric current in the resistor itself or in an adjacent resistor.

BACKGROUND OF THE INVENTION

In the case of in-circuit trimming applications, a typical goal is to trim one or more resistors which are part of the circuit to adjust an overall circuit output which depends on those resistances. This circuit output may be any measurable quantity, but is typically translated into a voltage or current to be measured electrically. For simplicity, let us refer to such a circuit output as "Vout". Usually, it is more convenient not to directly measure the resistance values of those trimmable resistors, because this may require extra electrical connections and/or extra measurements. Instead, one understands the relationship between changes in the trimmable resistors ($\Delta R1$, $\Delta R2$, etc), and changes in the circuit output ($\Delta V$out), or at least the relationship between the direction (sign) of each $\Delta R$ and the direction (sign) of changes in Vout. In this way, one can apply trims to the trimmable resistors, while monitoring only the intended Vout. This type of scenario applies to any trimming method (manual trimpot, laser trimming, digital trimming, thermal trimming).

Trimming methods exhibit differing properties and constraints of operation. Manual trimpots are fully bidirectional over their entire range of resistance, but require manual operation, may have limited precision, and may be prone to mechanical instability. Digital trimpots also may be fully bidirectional over their entire range of resistance, but are not passive resistors. Laser trimming has a more limited trim range, more limited bi-directionality, and is difficult to do after packaging.

Thermally-trimmable resistors feature electrically-driven trimming, may be done at any practical stage in the manufacturer-to-user chain (including after packaging), and once trimmed, they are purely-passive components. However, they may also have constraints on bi-directionality of trimming. These types of resistors may often be more easily trimmable in one direction than another. For example, certain thermally-trimmable polysilicon resistors may be readily trimmed down (in the direction of decreasing resistance), from its as-manufactured resistance value ($R_{as-mfr}$), by tens of percent of $R_{as-mfr}$, but after such a trim-down, may have only limited trim-up (recovery) range. Other trimming characteristics are also possible.

In an in-circuit trimming application, limitations to full bi-directionality significantly constrain what can be done, and/or constrain trimming performance (e.g. speed, precision, range). For example, if a single trimmable resistor (any trimming method), is trimmable only in one direction, then one must be more conservative in seeking the $V_{out}$ target. One must approach more slowly, to make sure that circuit settling times are accounted for, and one must be mindful of the quantization of the resistance trim, since the next trim may jump too far. Another example, if more than one trimmable resistor is used, then the optimal position of one resistor may depend on the position of the other, and vice-versa, but trims must be done sequentially, and so an individual trim of one resistor may reach an interim (non-optimal) target while irreversibly overshooting the optimal target (which may not be known until another resistor (or resistors) has reached its optimal position, or close to its optimal position).

In the specific case of thermal trimming, if one doesn't know the final (optimal) trim target, it may be necessary for the adaptive trim to proceed more slowly, consuming more trimming time.

SUMMARY OF THE INVENTION

The present invention provides a method to change the value of a thermally-trimmable resistor in a non-permanent way by raising the temperature of the thermally-trimmable resistor to a level that is between room temperature and a trimming temperature. By doing this, the trimming range that is available via true thermal trimming may be explored without actually trimming the value of the resistor. This is possible when the thermally-trimmable resistor, or a portion thereof, has an essentially non-zero temperature coefficient of resistance (TCR).

A heat pulse is applied to the thermally-trimmable resistor, or to a resistor that is adjacent to the thermally-trimmable resistor and serves as a heating resistor, in order to raise the temperature of the thermally-trimmable resistor to a level that is below a trimming temperature. While the temperature is raised, the value of the thermally-trimmable resistor is altered due to, and as a function of, its TCR. During this period, any measurable point of the circuit, including the output, can be probed to determine the effect of the resistance change on the circuit, or on another element in the circuit. When the temperature of the thermally-trimmable resistor returns to room temperature, its resistance value also returns to its initial (room-temperature) value.

In accordance with a first broad aspect of the present invention, there is provided a method for evaluating an effect of a change of resistance of a component in a circuit, the method comprising: subjecting at least one thermally-trimmable resistor, at least a portion of which has a non-zero temperature coefficient of resistance, to a heat source to raise its temperature above an operating temperature while remaining below a trimming temperature, thereby causing a temporary change in the at least one thermally-trimmable resistor's value; observing an effect of the temporary change on at least one of another component in the circuit, a point within the circuit, and an output of the circuit; and removing the heat source to reverse the temporary change.

In accordance with a second broad aspect of the present invention, there is provided a method for trimming a circuit having at least one thermally-trimmable resistor therein, at least a portion of the thermally-trimmable resistor having a non-zero temperature coefficient of resistance, the method comprising: subjecting at least a first thermally-trimmable resistor to a pre-trimming heat source to raise its temperature above an operating temperature while remaining below a trimming temperature, thereby causing a temporary change in a value of the first thermally-trimmable resistor; observing an effect of the temporary change on at least one of another component in the circuit, a point within the circuit, and an output of the circuit; removing the pre-trimming heat source to reverse the temporary change; and subjecting at least one of the at least a first thermally-trimmable resistor and a second thermally-trimmable resistor to a trimming heat source to bring its temperature to the trimming temperature in order to trim a parameter of the circuit.

In certain instances, an initial step of calibration is required in order to ascertain how far the temperature of the resistor can be raised without reaching trimming temperatures, in order to avoid overshooting and to determine a pre-scan range. The type of information needed for this calibration step is the correspondence between the pre-scan voltage or power, and the eventual trimmed value of the resistance at room temperature. This is especially true when applying the above-described methods to two thermally-trimmable resistors, where the optimum value of one depends on the value of the other.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
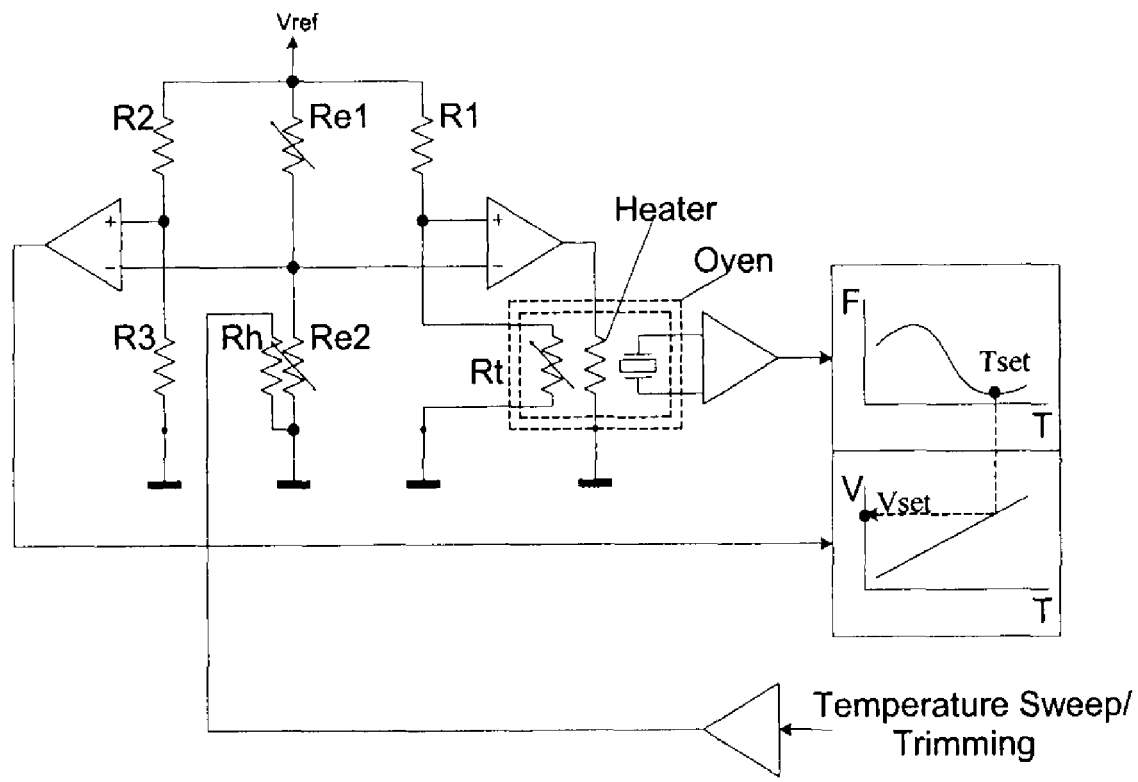
FIG. 1 is an example of a circuit to which the method of the present invention can be applied.

The specific case of thermal trimming provides an advantage over other trimming techniques having limited reversibility. The thermally-trimmable resistor may be electrically heated to temperatures significantly higher than room temperature or operating temperatures, without initiating significant thermal trimming. In such cases, if it has a significant non-zero temperature coefficient of resistance (TCR), then significant resistance changes may be available without committing to a trim. These reversible resistance changes may offer exploratory thermal pre-scanning of significant portions of the thermal trim range.

Thermally-trimmable resistors can offer this capability, exploratory thermal pre-scanning, to determine the desired trim-position, without committing the trim and irreversibly losing trim range. By exploratory pre-scanning, the approximate desired trim position can be ascertained, and then the trimming algorithm can take account of this position during the trim. This may be particularly important in cases where several thermally-trimmable resistors are used in a given circuit, since the optimal trim position of one thermally-trimmable resistor may depend sensitively on the precise trimmed position of another.

While this is true of any thermal trimming situation (even if the thermally-trimmable resistor does not have high thermal isolation), it is especially convenient when the thermally-trimmable resistor has high thermal isolation, since then the power needed for heating is lower.

Even if the pre-scan range does not cover the whole trim range, it may still be quite useful. For example, some thermally-trimmable resistors may have a trim range of some tens of % (e.g. 30%) down from its as-manufactured value. Within this range, there is bi-directionality, however the trimming is typically not fully-bidirectional over the entire trim range. For example in some cases an upper portion of the trim range (e.g. the top 5% or 10%), may be accessible only once, and within this range it may be difficult to trim up. In this case, the pre-scan may be particularly useful even if it is smaller than the full 30% trim range, because the pre-scan range may cover, or coincide with, the specific part of the trim range which is not bi-directional.

Consider a single thermally-trimmable resistor having large negative TCR (e.g. −1300 ppm/C), and which has significant trim-down range. The large negative TCR allows thermal pre-scanning of the single thermally-trimmable resistor in the same direction that it will be trimmed. With a TCR of −1300 ppm/C, it can be pre-scanned over a significant range without reaching a trimming temperature. Let's assume, for example, that we want to keep the pre-scanning temperature below 250° C. to avoid thermal trimming, this would be equivalent to a ΔT of ~225° C., assuming room-temperature is 25° C. Without considering $2^{nd}$-order temperature coefficient, this would give [−1300 ppm/° C.*225° C.]=almost 300000 ppm, almost ~30%—a significant useful pre-scan range, even if the whole trim range were larger.

If there were a significant positive $2^{nd}$-order temperature coefficient, (e.g. ~+1 ppm/$K^2$), then the pre-scan range would be reduced for this case of large negative TCR, but still a substantial pre-scan range would be available, based on the same basic principle. (If the $2^{nd}$-order temperature coefficient were negative, then in this example it would act to enhance the pre-scan range.)

Note that in the above case of a single thermally-trimmable resistor, it does not have a near-zero TCR, (since it is by itself and has TCR ~−1300 ppm/K). However, if it were combined with another resistor (whether thermally-trimmable or not), having positive TCR (for example, having TCR +430 ppm/K), then the overall TCR of the compound resistor could be brought near to zero. In this case, there could still be pre-scanning using the negative-TCR resistor, however, the range of pre-scanning would be reduced by a substantial fraction (e.g. by approximately 3, if the ratio of the portions was ~1:3 in order to achieve near-zero overall TCR).

Consider a thermally-trimmable voltage divider, where both resistors have trim-down properties similar to those described above. In this case some advantageous features can be obtained, since the TCRs of the thermally-trimmable resistors can be matched or near-matched, and since pre-scanning need not be done by the same resistor which is being thermally-trimmed. In a divider configuration, this allows pre-scanning to be done using thermally-trimmable resistors having positive TCR, since in this case the thermal trimming can be accomplished by the other thermally-trimmable resistor in the divider, opposite from that being used for pre-scanning.

For example, consider a voltage divider made from two thermally-trimmable resistors having TCR approximately +800 ppm/K. In this case, one can pre-scan one resistor (e.g. the "upper" divider resistor), increasing the resistance of that pre-scan resistor by about 15%, thus pre-scanning the divider voltage (Vout) in the corresponding direction (e.g. decreasing the divider voltage). Then, when the target divider voltage has been found by pre-scanning, one can thermally trim-down the other (e.g. "lower") divider resistor, by the amount decided during the thermal pre-scan of the first (e.g. "upper") divider resistor.

In cases like this, where the TCR is positive, if the $2^{nd}$-order temperature coefficient were positive, it would act to enhance the pre-scan range.

It should also be noted that in a voltage divider having 1:1 ratio the conversion from pre-scan of one of the divider resistors (e.g. "upper" resistor), to trim-target of the opposite divider resistor (e.g. "lower" resistor), is relatively straight-forward, since changes in either divider resistor affect Vout by substantially the same magnitude. If the divider ratio is not 1:1 (e.g. 10:1), then a fractional change in one of the resistors will cause a change in Vout of the same magnitude as will be caused by the same fractional change in the other resistor. Thus one may still convert the pre-scan information from one resistor into the correct trimming target for the opposite resistor.

In general, in a divider configuration, one may select which resistor to pre-scan depending on the TCRs and thermal-trimming characteristics of the divider resistors, in order for the pre-scan to imitate the effect of thermal trimming on divider voltage $V_{out}$. In another example, if the thermal-trimming increases the resistance, then if the TCR were negative one would pre-scan using the opposite divider resistor, while if the TCR were positive one would pre-scan using the same resistor as that intended to be thermally-trimmed.

Consider thermally-trimmable resistors having significant trim-down range, as described above. Consider compound resistors made from one portion of thermally-trimmable resistor having positive TCR, and another portion of resistance (not necessarily thermally-trimmable), having negative TCR, such that the overall TCR is close to zero and remains close to zero as the thermally-trimmable portion is thermally trimmed. If two such compound resistors are connected in a voltage-divider configuration, even though the overall TCR of each of the two divider resistors is close to zero, pre-scanning is available through the positive-TCR thermally-trimmable portion (or through the negative-TCR portion, if that portion has a separate control pin).

For example, if the thermally-trimmable positive-TCR portion has TCR ~+400 ppm/K, then this positive-TCR portion can be used for pre-scanning, followed by trimming-down a thermally-trimmable portion of the opposite divider-resistor. If the thermally-trimmable portion constituted, for example, 3/5 of the resistance of one of the divider resistors, and if one wanted to keep the pre-scan temperature below, for example, 250° C., then the pre-scan range would be approximately 400*250*3/5=60000 ppm=6%.

Consider the pre-scan technique in the context of thermally-trimmable resistors having the trim-down property. In order to implement the pre-scan technique, one may need to know the trim-down amount corresponding to an electrical heating pulse input (voltage-measured, or power-measured). Since the temperature range of pre-scanning can be significant, the temperature-variation of the pre-scan resistance may be non-linear. Thus one may need to pre-calibrate the single thermally-trimmable resistor or thermally-trimmable resistor-divider before embedding them in a larger circuit.

An application of the pre-scan technique is to pre-scan a circuit to find an optimum. For example, a maximum or minimum or other optimum of the circuit output signal or set of signals, such as adjusting the pre-scan signal to set contrast or brightness of a TV screen. The "controlled circuit output parameter" and the "parameter of interest" being optimized may be different. For example, the "parameter of interest" may be the frequency of an oscillator, while the "controlled circuit output parameter" may be a voltage applied to an oven which in turn controls that frequency.

Another area of application is a circuit in which there is significant cross-sensitivity between the effects of several (at least two) thermally-trimmable resistors. In this case, several iterations of pre-scan of each resistor may be required to find the "optimum" (since the perceived optimal position of one resistor may depend sensitively (and/or in a complex manner) on the position of the other, and vice-versa). For example, in the case of amplifier offset and gain. In such cases of cross-sensitivity, pre-scan can offer significant advantages over thermal trimming without pre-scan: pre-scanning is typically faster (e.g. some milliseconds for pre-scan instead of ~1 s or more for adaptive thermal trimming pulse sequence); also, pre-scanning is fully reversible, while typically the reversibility of thermal trimming is more limited, which could prevent finding the true optimum in cases of complex cross-sensitivity.

FIG. 1 shows a practical example of the pre-scan technique in an oven-controlled crystal oscillator (OCXO) application. OCXO circuits are well known in the prior art, and typically have an oven with heater and temperature sensor $R_t$ within it, along with the crystal itself. The circuitry external to the oven is designed to control the power applied to the heater, to maintain the oven temperature at a level (called "$T_{set}$") determined experimentally such that the crystal oscillator frequency (the frequency of the voltage output from the right-most amplifier) is least dependent on temperature variations. The heater is powered by the op-amp, which is configured to adjust (by negative feedback) the oven's temperature, such that the bridge circuit consisting of $R_{e1}$, $R_{e2}$, $R_1$ and $R_t$ is balanced. As an example: $R_1=R_2=R_3=10$ k$\Omega$; $R_{e1}$ and $R_{e2}$ are thermally-trimmable resistors with negative TCRs, and $R_{e1}=R_{e2}$ before any trimming; $R_t$ can be a thermistor having TCR approximately −4%/° C., where at 85° C. $R_t=R_1=10$ k$\Omega$. By pre-scan heating $R_{e2}$ (using heater-resistor $R_h$), this bridge can be intentionally (non-permanently) unbalanced, and thus the oven temperature will be changed due to the feedback circuit. By sweeping the voltage applied to $R_h$, the oscillator output can be effectively scanned over temperature, as depicted in the upper graph (F vs T) at the right side of FIG. 1. In the circuit depicted, one cannot directly measure the resistance $R_{e2}$ (since typically it is better not to disturb the impedance of the bridge). Therefore, in order to better implement the present invention in this context, resistors $R_2$ and $R_3$ are added at the left side of the circuit, along with another op-amp, in order to monitor the changes in $R_{e2}$ with high precision (high precision is needed since the OCXO application demands extreme precision of temperature control). The output voltage of this auxiliary amplifier is also monitored during pre-scan (depicted in the lower graph (V vs T)). By simultaneously observing both signals F vs T and V vs T, and recording the voltage "$V_{set}$" at which the variation of frequency with temperature is optimal, this recorded $V_{set}$ becomes an observable high-precision target for the thermal trimming operation which follows the pre-scan. After pre-scan is completed, the pre-scan power applied to $R_h$ is returned to zero, and then $R_h$ is used to thermally trim $R_{e2}$, until the output of the left-side amplifier reaches $V_{set}$. Because of the pre-scan, we know that when this $V=V_{set}$, the oven temperature will be at the particular desired temperature, $T_{set}$. This implementation of the technique relies on significant non-zero TCR of the thermally-trimmable resistor $R_{e2}$, which must in this case be negative. If, instead, the thermally-trimmable resistor had positive TCR, then one would pre-scan $R_{e1}$ while trimming $R_{e2}$.

This circuit gives an example of a case where the target output signal (frequency of the right-side amplifier output voltage), is not practical to be used directly in an electronic feedback circuit for trimming. This is because the oven has high thermal inertia and its temperature cannot respond quickly to increments or decrements of the adjustable resistor. Thus, the speed of the pre-scan procedure is limited by this thermal inertia of the oven. On the other hand, the auxiliary voltage from the left-side amplifier is able to respond much more quickly, and therefore can be used more efficiently in adaptive thermal trimming.

Another group of applications where this concept is helpful comprises applications where the judgment of what is "optimal" is not easily quantified or transformed into a quantified electrical signal, for example "brightness" or "contrast" or "uniformity" of an LCD display.

The following example demonstrates how the pre-scan works in the case where: (1) one directly measurable parameter (one output voltage) is used as an indicator of trimming during the adjustment procedure; (2) two different parameters of the circuit are to be adjusted (in this case, gain and offset); (3) the two parameters cannot be unambiguously defined from the directly measurable parameter (the output voltage is a potentially complex function of both parameters)

Consider an application circuit including amplifier with initial gain $K_i$ and initial offset $u_{ofin}$. Said gain can be trimmed and pre-scanned with the use of at least one thermally trimmable resistor $R_K$. The application circuit also contains a thermally-trimmable sub-circuit which generates an adjustable DC voltage $u_{ofDC}$ added to the output voltage of the amplifier to compensate the overall offset. The goals of the adjustment procedure are (a) tune voltage $u_{ofDC}$ such that output voltage of the whole application circuit equals zero at zero input signal; and (b) to tune gain $K_i$ to its target value $K_t$.

The output voltage at zero input signal equals:

$$U_0 = K_i \cdot u_{ofin} + u_{ofDC} \quad (1)$$

If reference input signal S is applied, then output voltage equals:

$$U_{0s} = K_i \cdot (u_{ofin} + S) + u_{ofDC} \quad (2)$$

Because the circuit has been designed with only one output, such that $u_{ofDC}$ cannot be measured directly, there are more unknowns than the number of equations. This system of two equations with three unknown parameters ($K_i$, $u_{ofamp}$ and $u_{ofDC}$) cannot be solved unambiguously. One may iterate to approach an approximate solution. To show this, assume that voltage $u_{ofDC}$ is trimmed such that $U_0=0$. This will occur when $u_{ofDC}=-K_i \cdot u_{ofin}$. Next, gain resistor $R_K$ is trimmed such that voltage $U_{0s}=K_t \cdot S$, where S is the known reference input signal and Kt is the known (pre-determined) target gain. However, after this second trimming, $U_0 \neq 0$, and voltage $u_{ofDC}$ must be trimmed again. Then gain resistor $R_K$ must be trimmed again. These trimming cycles can be repeated several times, to reach gain and offset of the overall circuit at or close to their targets.

The proposed pre-scan procedure improves the adjustment process. Assume that, before any permanent thermal trimming, at least one thermally trimmable resistor is reversibly heated (without thermally trimming), to temporarily change gain to a new value $K_1$, (which must be significantly different from the initial gain $K_i$, in order to enable the calculations below). Then the output voltage is measured at zero and non-zero reference input signals:

$$U_1 = K_1 u_{ofin} + u_{ofDC} \quad (3)$$

$$U_{1s} = K_1 \cdot (u_{ofin} + S) + u_{ofDC} \quad (4)$$

The following equations can then be derived from equations (1)-(4):

$$\frac{K_1 - K_i}{K_i} = \frac{(U_{1s} - U_1) - (U_{0s} - U_0)}{U_{0s} - U_0} \quad (5a)$$

$$u_{ofin} = \frac{U_1 - U_0}{K_1 - K_i} = \frac{(U_1 - U_0)(U_{0s} - U_0)}{K_i[(U_{1s} - U_1) - (U_{0s} - U_0)]} \quad (5b)$$

$$K_i = \frac{U_{0s} - U_0}{S} \quad (5c)$$

The target value for thermal trimming of $u_{ofDC}$ must be: $u_{ofDC} = -K_t \cdot u_{ofin}$, in order that the initial offset $u_{ofin}$ will be compensated after gain of the circuit will be trimmed to its target value $K_t$. With this intermediate target in mind, trimming is started. First, switch off pre-scan heating (gain returns to its initial value $K_i$). Then thermally trim $u_{ofDC}$ to set the output voltage to value:

$$U\_trim = K_i \cdot u_{ofin} - K_t \cdot u_{ofin} \quad (6)$$

$$= \left(1 - \frac{K_t}{K_i}\right) \cdot \frac{(U_1 - U_0)(U_{0s} - U_0)}{[(U_{1s} - U_1) - (U_{0s} - U_0)]}$$

by thermally trimming the sub-circuit which controls $u_{ofDC}$.

Next, the second thermal trimming operation adjusts the gain resistor $R_K$. Reference signal S is applied to the circuit, and gain resistor $R_K$ is thermally trimmed to set the output voltage to the predetermined value:

$$Us\_trim = K_t \cdot S$$

Based on pre-scan data, first target voltage for trimming offset $u_{ofDC}$ is not zero. This means that at initial gain $K_i$, offset is not compensated. Offset compensation is reached only after the gain is trimmed to its target value $K_t$. This is the result of "prediction" of the circuit behavior obtained during the pre-scan stage. The input signal may be an electrical signal (voltage or current). It also can be a non-electrical signal (pressure, acceleration, magnetic field, light radiation, etc.). In the second case, a sensor may be considered to be a part of the circuit to convert input signal into voltage. In this given example, the calibrated value of pre-scan heating (i.e. overheating temperature of the resistor, or dissipated power, or percent of resistance shift) is not needed. The only requirement is that the change in resistance must be large enough to allow accurate target calculation after measurements (equations (1)-(4)) are done. For example, if change of $U_1 - U_0$ is of the order of microvolts and the voltmeter has a resolution of millivolts, then an accurate calculation of the trim targets is impossible.

The pre-scan procedure can be rather fast. For example:

| | |
|---|---|
| measure $U_0$ | 10 ms |
| apply input signal | 10 ms |
| measure $U_{0\,s}$ | 10 ms |
| apply heating voltage | 10 ms |
| measure $U_{1\,s}$ | 10 ms |
| reset zero input signal | 10 ms |
| measure $U_1$ | 10 ms |
| turn off heating voltage and calculate Trim target | 10 ms |

Thus the total time consumed by the pre-scan may be less than 0.1 s.

The two previous examples describe two types of cases (i) where the pre-scan range covers the entire thermal trim range, and (ii) where the pre-scan range does not necessarily cover the entire thermal trim range. As shown in the second (gain-and-offset) example, if the pre-scan range does not cover the entire thermal trim range, and if one knows enough about the circuit being scanned, one may use pre-scanning to investigate the circuit to determine parameters needed to accurately calculate the trimming targets. On the other hand, if the pre-scan range does cover the entire needed trim range, then one may operate as shown in the first (OCXO) example.

One may simultaneously heat (pre-scan) any number of thermally-trimmable resistors, which may be a subset of the thermally-trimmable resistors present and in the circuit and available for pre-scanning.

Indeed, in the case where a plurality (N) of thermally-trimmable resistors are simultaneously pre-scanned, and where the pre-scan ranges do cover the entire needed trim range, one may use a pre-scan-and-hold technique, as follows. Consider simultaneous pre-scan of the N resistors to find an optimum set of trim positions, and record the optimum circuit output. Next, turn off pre-scan for the Nth resistor, while holding the pre-scan positions of the remaining N−1 resistors. Then trim that Nth resistor to bring the circuit output to its optimum value. Next, turn off pre-scan for the (N−1)th resistor, while holding the pre-scan positions of the remaining N−2 resistors. Then trim the (N−1)th resistor to again bring the circuit output to its optimum position. Continue this procedure until there are no more resistors remaining to be trimmed. As specifically described, this pre-scan-and-hold procedure works only if the pre-scan is in the same direction as the thermal trim. However, even if in some cases the pre-scan is in the opposite direction as the thermal trim, there may be groups of thermally-trimmable resistors such as voltage dividers, where one may consider the entire divider as one of the N thermally-trimmable and pre-scannable units— when appropriate in the procedure, turn off the pre-scan then thermally-trim the opposite resistor in the divider.

In the context of pre-scanning, in general the thermal trimming could be done by self-trimming or by an auxiliary resistor, or some other source of heat-pulses for trimming, because the trimming target(s) are established before actually executing the trim, and because during an adaptive trimming sequence one typically removes the trimming signal while making measurements. However, the pre-scan itself must in most cases not be done by self-heating of the functional resistor itself—it needs a heat source electrically isolated from itself. This is because pre-scan is typically intended to find a fine-tuned optimum for real circuit function, within a significant pre-scan range, and it would in most cases defeat the purpose if one severely disturbed the circuit by applying a relatively large voltage and current to a critical circuit element, if that voltage or current were not normally present during normal operation of the circuit.

The embodiments of the invention described above are intended to be exemplary only. The scope of the invention is therefore intended to be limited solely by the scope of the appended claims.

The invention claimed is:

1. A method for evaluating an effect of a change of resistance of a component in a circuit, the method comprising:
   subjecting at least one thermally-trimmable resistor, at least a portion of which has a non-zero temperature coefficient of resistance, to a heat source to raise its temperature above an operating temperature while remaining below a trimming temperature, thereby causing a temporary change in said at least one thermally-trimmable resistor's value;
   observing an effect of said temporary change on at least one of another component in said circuit, a point within said circuit, and an output of said circuit; and
   removing said heat source to reverse said temporary change.

2. A method as claimed in claim 1, wherein said observing comprises probing at least one measurable point in said circuit.

3. A method as claimed in claim 1, wherein said subjecting at least one thermally-trimmable resistor to a heat source comprises subjecting a resistor that is part of a voltage divider configuration within said circuit.

4. A method as claimed in claim 3, wherein said observing an effect comprises observing an effect on an output voltage of said voltage divider.

5. A method as claimed in claim 3, wherein said subjecting a resistor within a voltage divider configuration to a heat source comprises subjecting a resistor that will be thermally-trimmed in order to reach a desired output voltage of said voltage divider.

6. A method as claimed in claim 3, wherein said subjecting a resistor within a voltage divider configuration to a heat source comprises subjecting a resistor opposite to a resistor that will be thermally-trimmed in order to reach a desired output voltage of said voltage divider.

7. A method as claimed in claim 1, wherein said subjecting a thermally-trimmable resistor to a heat source comprises subjecting to a heat source a compound resistor made from one portion having a positive temperature coefficient of resistance and another portion having a negative temperature coefficient of resistance.

8. A method as claimed in claim 7, wherein said subjecting comprises subjecting one of said one portion having a positive temperature coefficient of resistance and another portion having a negative temperature coefficient of resistance.

9. A method as claimed in claim 8, wherein said subjecting comprises subjecting said one portion having a positive temperature coefficient of resistance to a heat source.

10. A method as claimed in claim 1, wherein said subjecting at least one thermally trimmable resistor comprises subjecting a first thermally-trimmable resistor to said heat source, observing an effect of said temporary change on at least one parameter of said output of said circuit, removing said heat source from said first thermally-trimmable resistor, subjecting a second thermally-trimmable resistor to said heat source, observing an effect of said temporary change on said at least one parameter of said output of said circuit, and removing said heat source from said second thermally-trimmable resistor.

11. A method as claimed in claim 1, wherein said observing an effect comprises monitoring at least one of voltage versus temperature and frequency versus temperature at said output of said circuit.

12. A method as claimed in claim 1, wherein said causing a temporary change in a value of said at least one thermally-trimmable resistor comprises covering a range of values for said resistor that includes an entire thermal trim range.

13. A method as claimed in claim 1, wherein said subjecting at least one thermally-trimmable resistor comprises subjecting more than one thermally-trimmable resistors to a plurality of heat sources simultaneously.

14. A method as claimed in claim 13, wherein said subjecting more than one thermally-trimmable resistors comprises subjecting single thermally-trimmable resistors to a plurality of heat sources to cause said temporary change in a same direction as a trimming direction for said single thermally-trimmable resistors.

15. A method as claimed in claim 13, wherein said subjecting more than one thermally-trimmable resistors to said plurality of heat sources simultaneously comprises subjecting N resistors simultaneously to said plurality of heat sources, removing heat from an Nth resistor while subjecting N−1 resistors to said plurality of heat sources, and continuing said procedure until heat is applied to a single resistor.

16. A method as claimed in claim 1, further comprising a step of calibration in order to determine how far said temperature can be raised above said operating temperature while remaining below said trimming temperature.

17. A method as claimed in claim 1, wherein a range for said temporary change in said value corresponds to a unidirectional portion of a trimming range of said thermally-trimmable resistor.

18. A method as claimed in claim 1, further comprising thermally-isolating said thermally-trimmable resistor.

19. A method as claimed in claim 1, wherein said effect of said temporary change is a change in a parameter of said output of said circuit.

20. A method as claimed in claim 1, wherein said effect of said temporary change is a change in at least two parameters of said output of said circuit.

* * * * *